United States Patent [19]  
Besson

[11] 4,012,700  
[45] Mar. 15, 1977

[54] CAPACITIVE ADJUSTING DEVICE FOR A QUARTZ CRYSTAL OSCILLATOR

[75] Inventor: René Besson, Neuchatel, Switzerland

[73] Assignee: Ebauches S.A., Neuchatel, Switzerland

[22] Filed: Feb. 4, 1976

[21] Appl. No.: 655,240

[30] Foreign Application Priority Data

Feb. 28, 1975 Switzerland .................. 2545/75

[52] U.S. Cl. .................. 331/116 R; 361/277; 310/9.4; 331/177 R
[51] Int. Cl.² .................. H03B 5/32
[58] Field of Search .......... 331/116 R, 158, 177; 317/249 R, 256; 310/9.4, 9.3

[56] References Cited
UNITED STATES PATENTS

| 1,580,057 | 4/1926 | Lewis | 317/261 |
| 3,737,805 | 6/1973 | Shimodaira et al. | 317/249 R |
| 3,796,968 | 3/1974 | Luscher | 310/9.4 |
| 3,969,640 | 7/1976 | Staudte | 317/249 |

Primary Examiner—John Kominski  
Attorney, Agent, or Firm—Imirie, Smiley & Linn

[57] ABSTRACT

A capacitive adjusting device for a quartz crystal oscillator utilizing one of the metallization provided on the quartz crystal as a common electrode for a plurality of capacitors, the second electrodes of which are provided as metallized strips on a portion of a ceramic base member forming part of the casing containing the quartz crystal.

3 Claims, 3 Drawing Figures

CAPACITIVE ADJUSTING DEVICE FOR A QUARTZ CRYSTAL OSCILLATOR

BACKGROUND OF THE INVENTION

The present invention concerns a capacitive device for adjusting the frequency of a quartz crystal oscillator.

A quartz crystal oscillator usually comprises a trimmer, that is to say, a variable reactive impedance device, mounted in series or in parallel with the quartz crystal for correcting the frequency variations due to the manufacturing tolerances of the quartz crystal and the oscillator drive circuit, and also due to unstable features such as ageing, shocks and the like.

An oscillator is known in which the trimmer is constituted by one of the electrodes of the quartz crystal and a deformable conductive surface located opposite thereto, thus fulfilling the function of counterelectrode to earth. By varying the distance between the electrode and the deformable surface, the value of the capacitor connected in parallel with the quartz is modified, thus making it possible to adjust the frequency of the oscillator in a relatively restricted range.

Whilst reducing the parasitic capacitance associated with a conventional trimmer, this embodiment has several disadvantages: too small adjusting range; a nonlinear relationship between the position of the deformable surface and the value of the capacitor; mechanical constraints on the connection between deformable and ceramic surface, large volume occupied by the adjusting screw.

SUMMARY OF THE INVENTION

According to the present invention there is provided a capacitive device for adjusting the frequency of a quartz crystal oscillator comprising, a quartz crystal, a plurality of plane capacitors having a common electrode constituted by a metallisation layer of the quartz crystal, the other electrodes of the capacitor being provided by several metallised strips disposed on a base member forming part of a casing containing the quartz crystal and opposite the metallisation layer of the quartz crystal, the metallised strips extending externally of the casing along tracks which are selectively connectable to earth in order to adjust the frequency of the oscillator.

BRIEF DESCRIPTION OF THE DRAWINGS

The present invention will be described further, by way of example, with reference to the accompanying drawings, in which.

DETAILED DESCRIPTION

Figure 1:
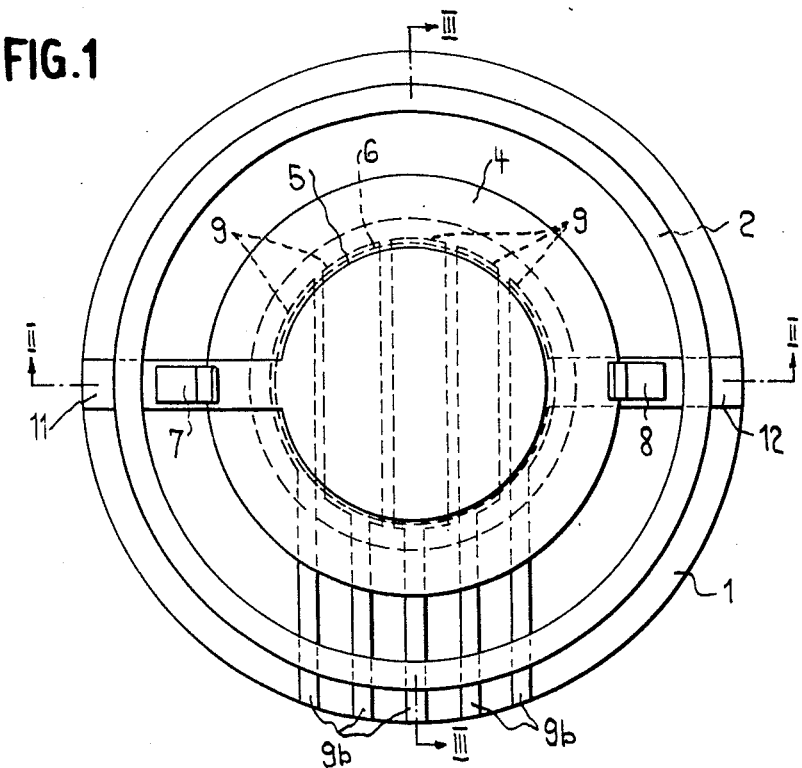
FIG. 1 shows a plan view of the quartz crystal and the capacitive device both located in a case.
Figure 2:
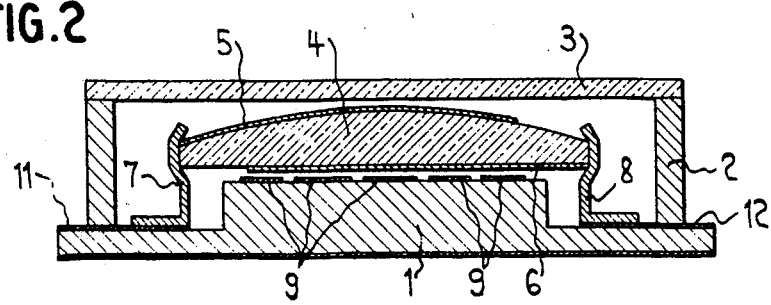
FIGS. 2 and 3 are views in section, taken on the lines II — II and III — III of FIG. 1.
Figure 3:
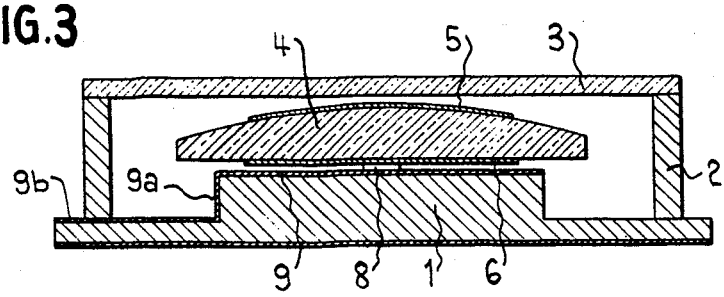

The quartz crystal 4 (See FIG. 2), cut for example along the section AT, has the shape of a plano-convex lens. The plane surface has a circular metallised layer 6 covering part of its surface, the layer having a rectilinear radial extension for contact with a support 8. Similarly, the convex surface has a metallisation layer 5 in contact with a support 7. The metallisations 5 and 6 constitute the electrodes of the quartz which is mechanically retained in the position determined by the supports 7 and 8. These supports 7 and 8 are secured on conductive tracks 11 and 12, which are partial metallisations of the circular ceramic base member 1. The circular base member 1 has a central cylindrical raised portion having a plane surface parallel to the plane surface of the quartz crystal 4 and the raised portion and the quartz crystal 4 are concentric. Parallel metal surfaces 9 are disposed on the surface of the raised portion and extend over the edges of the shoulder as tracks 9a and, over the outer portion of the base 1, as tracks 9b. A cylindrical sleeve 2 is secured to the base 1, the diameter of which sleeve is selected so that the ends of the tracks 11, 12 and 9b are accessible, thus making it possible to solder connecting wires to the outside of the case containing the quartz crystal. A cover 3, of glass, for example, seals the case in order to maintain the quartz into vacuum.

The electrode 6 and the metal surfaces 9 disposed oppositely to each other constitute an assembly of plane capacitors.

As an illustration, an idea of the possibilities of this device may be obtained, where s: surface of the electrode 6
d: diameter of the electrode 6 = 3mm
a: distance between the electrode 6 and the surfaces 9 = 0.15mm The total capacitance would be:

$$C = \epsilon \cdot s/a \cong \epsilon_o \cdot \pi . d^2/4a = 0.40 \text{ pF}$$

in which : $\epsilon_o$ : di-electric constant of the vacuum.

The corresponding change of frequency depends on the values of the parameters of the quartz crystal and the operating circuit:

$C_1, C_o$: dynamic and static capacitances of the quartz crystal $C_T$: capacitance in parallel with the quartz.

In the case of a high frequency oscillator with very low current consumption, $C_T$ must be reduced to a minimum whilst maintaining good stability of this capacitance.

With a 4 MHz quartz crystal, it is possible to estimate $C_o \cong 1$ pF and $C_1 \cong 0.005$ pF. Furthermore, it is thought that $C_T$ could be of the order of 4 pF.

Under these conditions the effect of a variations of $C_T$ on the frequency is $$\frac{\Delta f}{f} = \frac{-C_1}{2(C_o + C_T)^2} \cdot \Delta C_T$$

for $\Delta C_T = 0.40$ pF, $\frac{\Delta f}{f} = 4 \cdot 10^{-5}$ for
$\Delta C_T = 0.40$ pF, $\Delta f/f = 4 \cdot 10^{-5}$ representing a range of adjustment of approximately 4 seconds per day, which is sufficient for practical applications.

The capacitors formed by one of the metal parts 9 and the common plate 6 may be connected together in various of the possible combinations and the combination selected is mounted in parallel with the quartz crystal. The surfaces of the metal parts may be of equal size or disposed so as to produce a progression of the values of capacitance according to a desired function. The ratio $C_o/C_1$ is defined by the section of the quartz.

The value of $C_o$ depends on the geometry of the electrodes.

We claim:

1. A capacitive device for adjusting the frequency of a quartz crystal oscillator, comprising a quartz crystal, an assembly of plane capacitors having a common electrode constituted by a metallisation layer of the quartz crystal, the other electrodes of the capacitor being provided by several metallised strips disposed on a base member forming part of a casing containing the quartz crystal and opposite the metallisation layer of the quartz crystal, the metallised strips extending externally of the casing along tracks which are selectively connectable to earth in order to adjust the frequency of the oscillator.

2. A device according to claim 1, in which the metallised strips on the base member are of unequal size.

3. A device according to claim 1, in which the metallised strips on the base member are of the same size.

* * * * *